United States Patent [19]

Leonida

[11] Patent Number: 5,353,025
[45] Date of Patent: Oct. 4, 1994

[54] METHODS AND APPARATUS FOR DIGITALLY ENCODING REPETITIVE ANALOG WAVEFORMS

[75] Inventor: Dan Leonida, Ottawa, Canada

[73] Assignee: Northern Telecom Limited, Montreal, Canada

[21] Appl. No.: 13,560

[22] Filed: Feb. 4, 1993

[51] Int. Cl.$^5$ ............................................. H03M 1/00
[52] U.S. Cl. ................................. 341/122; 341/155; 341/162
[58] Field of Search ............... 341/122, 161, 162, 163, 341/164, 155

[56] References Cited

U.S. PATENT DOCUMENTS

| | | | |
|---|---|---|---|
| 4,217,524 | 8/1980 | Kinder et al. | 315/364 |
| 4,528,591 | 7/1985 | Liepe et al. | 341/164 |
| 4,578,667 | 3/1986 | Hollister | 341/122 |
| 5,212,485 | 5/1993 | Shank et al. | 341/161 |

*Primary Examiner*—Howard L. Williams
*Attorney, Agent, or Firm*—C. W. Junkin

[57] ABSTRACT

In methods and apparatus for encoding a repetitive analog waveform as m n-bit digital words, p analog samples of the repetitive waveform are taken at each of m distinct sampling points, and q bits are derived from each distinct sample, where m, n, p and q are positive integers, p and q are less than n, and $p \times q = n$. The methods and apparatus employ novel methods and apparatus for generating a pulse train having a precisely controlled duty cycle to define sampling times at which the samples are taken. The encoding methods and apparatus are useful for encoding high speed waveforms with relatively low speed circuitry.

5 Claims, 7 Drawing Sheets

METHODS AND APPARATUS FOR DIGITALLY ENCODING REPETITIVE ANALOG WAVEFORMS

FIELD OF THE INVENTION

This invention concerns methods and apparatus for digitally encoding repetitive analog waveforms.

BACKGROUND OF THE INVENTION

In conventional methods and apparatus for digitally encoding repetitive analog waveforms, the analog waveforms are sampled at a plurality of sampling points, and each analog sample is encoded as a multi-bit digital word. The analog sample must be held for the duration of the complete multi-bit encoding operation.

Generally, a sample and hold circuit is provided to hold the analog sample during the multi-bit encoding operation. Sample and hold circuits suitable for sampling high frequency waveforms typically include high speed components such as Schottky bridges, step recovery diodes and pulse transformers which must be electromagnetically isolated from one another to prevent undesired cross-coupling. The requirement for electromagnetic isolation and the construction of some of the components (e.g. the pulse transformers) are not compatible with monolithic integration of the sample and hold circuits, so the cost of such sample and hold circuits can be quite high, particularly where many repetitive waveforms must be sampled and encoded in parallel.

The required holding time for the analog sample can be reduced by deriving all bits of the multi-bit digital word simultaneously as in "flash" analog to digital conversion. Unfortunately, flash analog to digital converters employ a large number of comparators connected in parallel to derive all bits of the multi-bit digital word simultaneously, and this parallel connection of comparators contributes a large parasitic capacitance which limits the maximum operating speed. Moreover, flash analog to digital converters are now rather expensive for applications in which several repetitive waveforms must be encoded in parallel.

For example, in a tester described in detail below, electromagnetic emissions are sensed simultaneously by over one thousand probes, and the resulting analog waveforms are digitally encoded in parallel. If relatively expensive sample and hold circuits or flash analog to digital converters are required for each encoding channel, the overall cost impact could be very significant.

SUMMARY OF THE INVENTION

This invention provides novel methods for digitally encoding repetitive analog waveforms.

Accordingly, one aspect of the invention provides a method for encoding a repetitive analog waveform as m n-bit digital words, where m and n are positive integers. The method comprises taking analog samples at each of m distinct sampling points, and digitally encoding the analog samples. Each of the m distinct sampling points has a respective predetermined delay with respect to a reference point on the repetitive waveform. Each predetermined delay is a sum of an integer number of fine delay increments defined by a delay lock loop and an integer number of coarse delay increments defined by a counter. The delay is incremented through a full range of coarse delay increments before each addition of a fine delay increment.

In one embodiment, a single analog sample is taken from each of m×n periods of the repetitive waveform, and n samples are taken at each sampling point before incrementing the delay to move to a next sampling point. Each predetermined delay is a sum of an integral number of fine delay increments and an integral number of coarse delay increments. The delay is incremented through a full range of coarse delay increments before each addition of a fine delay increment.

In another embodiment, a distinct analog sample is taken at each of p distinct sampling points in each of n periods of the repetitive waveform for each of q sets of p distinct sampling points, p and q being positive integers and p×q=m. Each respective delay of the p sampling points in each of the q sets of sampling points is a sum of a predetermined base delay and an integer number of delay increments. The delay increments are the same for all of the q sets of sampling points, but the base delays for each of the q sets of sampling points are different sums of an integral number of fine delay increments and an integral number of coarse delay increments. The base delay is incremented through a full range of coarse delay elements n times before each addition of a fine delay increment.

The bits may be derived by successive approximation.

More generally, some benefits of the invention summarized above can be obtained even if more than one bit of the n-bit words is derived from each sample.

This invention also provides novel apparatus for digitally encoding repetitive analog waveforms.

Accordingly, another aspect of the invention provides apparatus for encoding a repetitive analog waveform as m n-bit digital words, where m and n are positive integers. The apparatus comprises a sampler for taking n distinct analog samples of the repetitive waveform at each of m distinct sampling points, and an encoder for digitally encoding each sample. Each of the distinct sampling points has a respective predetermined delay with respect to a reference point on the repetitive waveform.

The sampler may comprise a clock generator for generating a clock signal at a clock rate, a sampling pulse generator for deriving sampling pulses from the clock signal, a fine delay element responsive to a fine delay select code to delay the sampling pulses relative to the clock signal by a fine delay corresponding to the fine delay select code, and a processor operable to cycle the fine delay select code.

The fine delay element may be responsive to the fine delay select code and the clock signal to generate a modified clock signal having a duty cycle which corresponds to the fine delay select code, and the sampling pulse generator may comprise a frequency multiplier operable to generate sampling pulses at a multiple of the clock rate, the sampling pulses being synchronized to a trailing edge of the modified clock signal.

The sampling pulse generator may further comprise a counter for counting sampling pulses, and a sampling pulse gate responsive to outputs of the counter and to a coarse delay select code to compare the outputs of the counter to the coarse delay select code and to pass a sampling pulse only when the outputs of the counter match the coarse delay select code, the processor being operable to cycle the coarse delay select code.

The encoder may comprise a comparison circuit for comparing samples to stored signals, and a processor for controlling the comparison circuit to effect analog to digital conversion of the samples.

The comparison circuit may comprise a digital to analog converter for converting digital signals supplied by the processor to analog reference signals, a comparator for comparing samples to the analog reference signals, and a timing element responsive to a sampling pulse for providing a single bit corresponding to a result of the comparison at a sampling point corresponding to the sampling pulse. Arrays of such digital to analog converters and comparators are available as monolithic integrated circuits at relatively low cost for multichannel applications (e.g. part number SP93808 sold by Plessey Semiconductors Ltd., Cheney Manor, Swindon, Wiltshire, SN2 2QW, U.K.).

More generally, another aspect of the invention provides apparatus for encoding a repetitive analog waveform as m n-bit digital words, where m and n are positive integers, the apparatus comprising a sampler for taking p distinct analog samples of the repetitive waveform at each of m distinct sampling points, each of the m distinct sampling points having a respective predetermined delay with respect to a reference point on the repetitive waveform, and an encoder for encoding each sample as a q digital bits, where p and q are positive integers less than n, and $p \times q = n$.

Another aspect of the invention provides a method for generating a pulse train having a controlled duty cycle. This method is useful in the generation of sampling pulses at very precise sampling times in the method for encoding a repetitive analog waveform as described above. The method for generating the pulse train having a controlled duty cycle comprises comparing a repetitive waveform having a finite non-zero slope over at least a portion of its period to a steady state signal level with a binary output comparator to generate a pulse train. The pulse train has a first value when a difference between the repetitive waveform and the steady state signal level has a first sign and a second value when the difference between the repetitive waveform and the steady state signal level has a second sign. The steady state signal level is adjusted to control the duty cycle of the pulse train.

Yet another aspect of the invention provides a duty cycle controller which is useful as part of the encoding apparatus described above for defining very precise sampling times for sampling the repetitive waveform. The duty cycle controller comprises a waveform generator for generating a repetitive waveform having a finite non-zero slope over at least a portion of its period, a signal generator for generating a signal having a steady state signal level, and a binary output comparator for comparing the waveform to the steady state signal level. The comparator generates a pulse train having a first value when a difference between the waveform and the steady state signal level has a first sign and a second value when the difference between the waveform and the steady state signal level has a second sign. The signal generator is controllable to adjust the steady state signal level to thereby adjust the duty cycle of the pulse train.

BRIEF DESCRIPTION OF THE DRAWINGS

Embodiments of the invention are described below by way of example only. Reference is made to accompanying drawings, in which.

DESCRIPTION OF EMBODIMENTS

Figure 1:
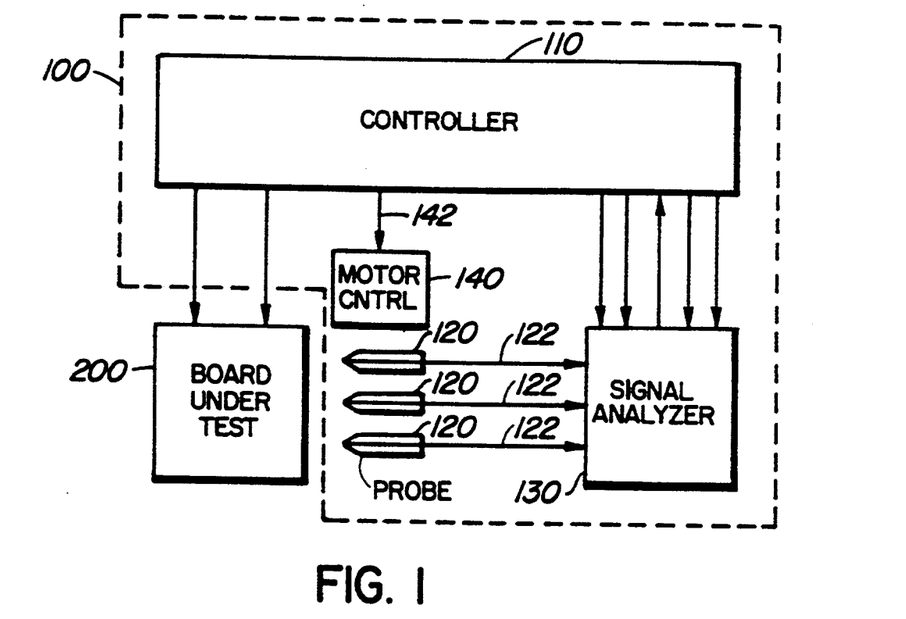
FIG. 1 is a block schematic diagram of a circuit board tester which incorporates an analog to digital converter according to one embodiment of the invention.

FIG. 1 is a block schematic diagram of a tester 100 for non-contact testing an electronic circuit board 200. The tester 100 comprises a sampler in the form of a controller 110, an array of electromagnetic emission sensing probes 120, an encoder in the form of a signal analyzer 130, and a motor control circuit 140. For simplicity, only three of the probes 120 are shown, although over one thousand may be provided.

Figure 2:
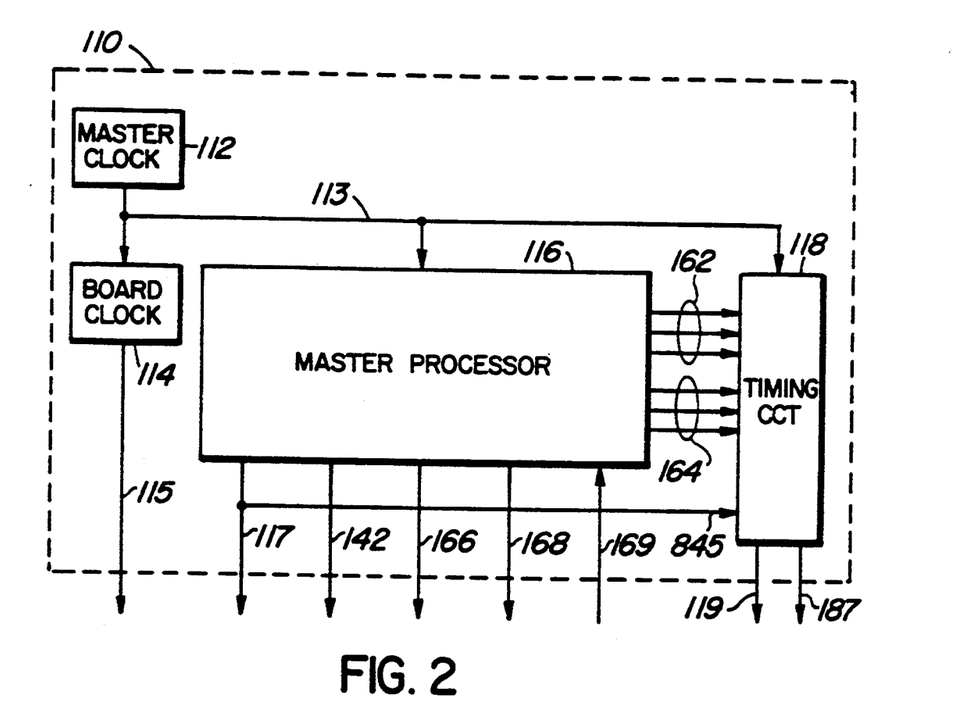
FIG. 2 is a block schematic diagram of a controller of the tester of FIG. 1.

FIG. 2 is a block schematic diagram showing the controller 110 in greater detail. The controller 110 comprises a master clock generator 112, a board clock generator 114, a master processor 116 and a timing circuit 118. The master clock generator 112 provides a master clock signal on a master clock bus 113 to run the board clock generator 114, the master processor 116 and the timing circuit 118. The master clock signal has a master clock rate, typically approximately 1 MHz.

The board clock generator 114 is a phase lock loop configured to generate a board clock signal which is synchronized to leading edges of the master clock signal and which has a board clock rate which is a multiple of the master clock rate. The board clock signal is applied via a board clock lead 115 to the circuit board 200 to run the circuit board 200. Preferably, the board clock rate is set as close as possible to the clock rate at which the circuit board 200 normally operates so that the operation of the circuit board 200 under test conditions approximates its operation under normal operating conditions. The master processor 116 applies test input signals to the circuit board 200 via one or more test input leads 117 to start operation of the circuit board 200 at a time which is synchronized to operation of the tester 100 and to exercise predetermined elements of the circuit board 200.

The timing circuit 118 generates sampling pulses for application to the signal analyzer 130 via a timing lead 119. The sampling pulses trigger sampling of the electromagnetic emissions sensed by the probes 120, and are synchronized to the master clock signal, but the precise timing of the timing pulses is controlled by the master processor 116, as explained in greater detail below.

Figure 3:
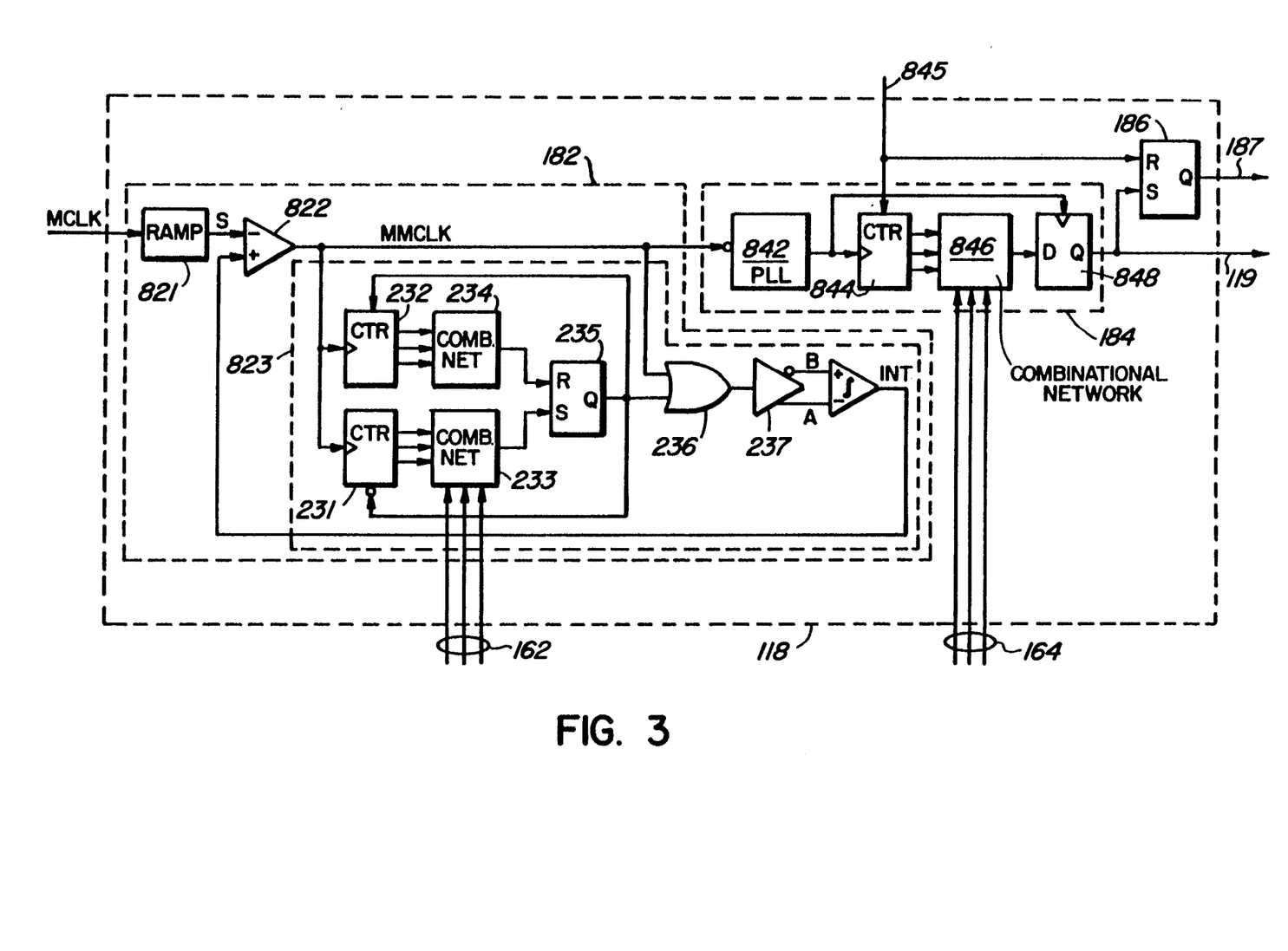
FIG. 3 is a block schematic diagram of a timing circuit of the controller of FIG. 2.

FIG. 3 is a block schematic diagram showing the timing circuit 118 in greater detail. The timing circuit 118 comprises a duty cycle controller in the form of a fine delay element 182, a sampling pulse generator 184, and an RS flip flop 186.

The fine delay element 182 comprises a ramp generator 821 which generates a sawtooth signal S synchronized to the master clock signal MCLK. The fine delay element 182 further comprises a comparator 822 which compares the sawtooth signal S to a feedback signal INT to generate a modified master clock signal MMCLK at the master clock rate, the modified master clock signal MMCLK having a duty cycle which corresponds to a fine delay select code supplied by the main processor 116 on a fine delay select bus 162.

The feedback signal INT is generated by a feedback circuit 823 from the modified master clock signal MMCLK and from the fine delay select code. The feedback circuit 823 comprises a pair of counters 231, 232, a pair of combinational networks 233, 234, an RS flip flop 235, an OR gate 236, a differential buffer 237 and a differential integrator 238 connected as shown in FIG. 3. When enabled, one counter 231 counts pulses of the modified master clock signal MMCLK, and its combinational network 233 compares the current count to the fine delay select code, setting the RS flip flop 235 when the current count matches the fine delay select code. The output of the flip flop 235 is fed back to enable inputs of the counters 231, 232, so that setting the flip flop 235 disables the one counter 231 and enables the other counter 232. The other counter 232 then counts pulses of the modified master clock signal MMCLK, and its combinational network 234 compares the current code to a fixed count, resetting the RS flip flop 235 when the current count matches the fixed count. Resetting the flip flop 235 enables the one counter 231 and disables the other counter 232 to restart the cycle. Consequently, the output of the flip flop 235 is alternately held high for a number of master clock cycles which corresponds to the fine delay select code and held low for a number of master clock cycles which corresponds to the fixed count. The OR gate 236 combines the output of the flip flop 235 with the modified master clock signal MMCLK, the differential buffer 237 provides a non-inverted version A and an inverted version B of the result, and the differential integrator 238 integrates the difference between these signals to generate the feedback signal INT.

Figure 4:
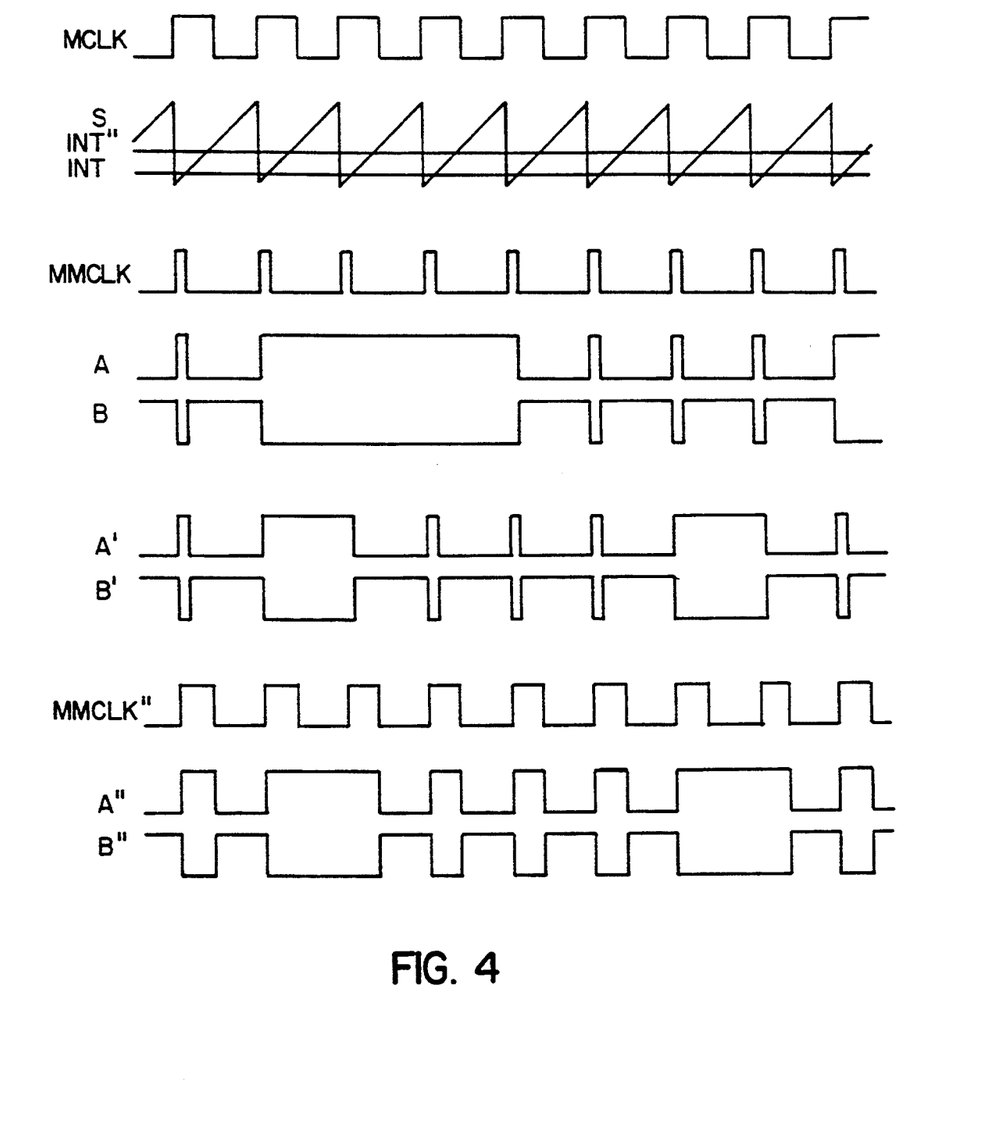
FIG. 4 is a timing diagram illustrating the operation of a delay element of the timing circuit of FIG. 3.

FIG. 4 is a timing diagram illustrating the operation of the delay element 182. If the delay select code is set at 3 and the fixed count is set at 4, the non-inverted output A of the differential buffer 237 is held high for three cycles of the modified master clock signal MMCLK, and then follows the modified master clock signal MMCLK for four cycles. The feedback signal INT is the integrated difference between the non-inverted output A and its inversion B which, at steady state, must settle at a value which causes the comparator 822 to set the duty cycle of the modified master clock signal MMCLK so that the DC content of the non-inverted and inverted outputs A, B are equal. If the delay select code is then changed from 3 to 1, the non-inverted output A' is held high for only one cycle of the modified master clock signal MMCLK before following the modified master clock signal for four cycles. Consequently, the non-inverted and inverted outputs A', B' have non-equal DC content and the feedback signal INT begins to rise, increasing the duty cycle of the modified master clock signal MMCLK. The circuit stabilizes at a new value INT" of the feedback signal which provides a modified master clock signal MMCLK" having a duty cycle which is high enough that the DC content of the non-inverted and inverted inputs A", B" are brought back into balance. Consequently, the delay element 182 operates as a "delay lock loop" to precisely control the duty cycle of the modified master clock signal MMCLK in increments determined by the fine delay select code supplied by the master processor 116.

(The example illustrated in FIG. 4 is contrived for easy illustration of the operation of the delay element 182. In the tester 100, the delay element 182 is used to adjust the duty cycle of the modified master clock signal by increments which are 5% or less of a period of the master clock signal. Such adjustments require a much higher value of the fixed count programmed into one of the combinational networks 234, and are too small to be readily perceived in a timing diagram. However, the method used to make such adjustments is essentially as illustrated. Moreover, in a more flexible implementation of the delay element 182, the combinational network 234 which determines the fixed count may include programmable elements so that the fixed count can be adjusted to adjust the size of the increments by which the duty cycle is adjusted.)

The sampling pulse generator 184 comprises a frequency multiplier in the form of a phase lock loop 842 which is configured to provide sampling pulses synchronized to trailing edges of the modified main clock signal MMCLK and having a rate which is a multiple of the master clock rate, typically about 20 MHz. The sampling pulse generator 184 further comprises a counter 844 and a sampling pulse gate in the form of a combinational network 846 and a flip flop 848. The counter 844 is reset by a signal on reset lead 845 supplied by the master processor 116, and counts sampling pulses provided by the phase lock loop 842. The combinational network 846 compares the count to a digital coarse delay select code supplied by the master processor 116 on coarse delay select bus 164, and provides a logical "1" only when the count matches the coarse delay select code. The flip flop 848 passes a sampling pulse synchronized to the trailing edge of the delayed clock signal only when the count matches the coarse delay select code.

The delay provided by the fine delay element 182 is selected to divide each coarse delay interval into an integer number of fine delay intervals. The number of coarse delay intervals and fine delay intervals for a given sampling pulse passed by the combinational network 846 and flip flop 848 are selected by the master processor 116 according to a sampling algorithm as explained in greater detail below.

Because operation of the circuit board 200 is synchronized to leading edges of the master clock signal MCLK and sampling pulses are synchronized to trailing edges of the modified master clock signal MMCLK, the sampling pulses have a variable delay with respect to the start of the circuit board operation. The variable delay is determined by the coarse and fine delay select codes.

The RS flip flop 186 of the timing circuit 118 has a reset input connected to the reset lead 845 of the counter 844 and a set input connected to the timing lead 119. Consequently, the RS flip flop 186 is reset together with the counter 844 and set each time a sampling pulse is generated by the sampling pulse generator 184.

The signal analyzer 130 comprises several signal analysis elements 132. Each signal analysis element 132 is connected to several of the probes 120, and analyzes electromagnetic emissions sensed by its associated probes 120.

Figure 5:
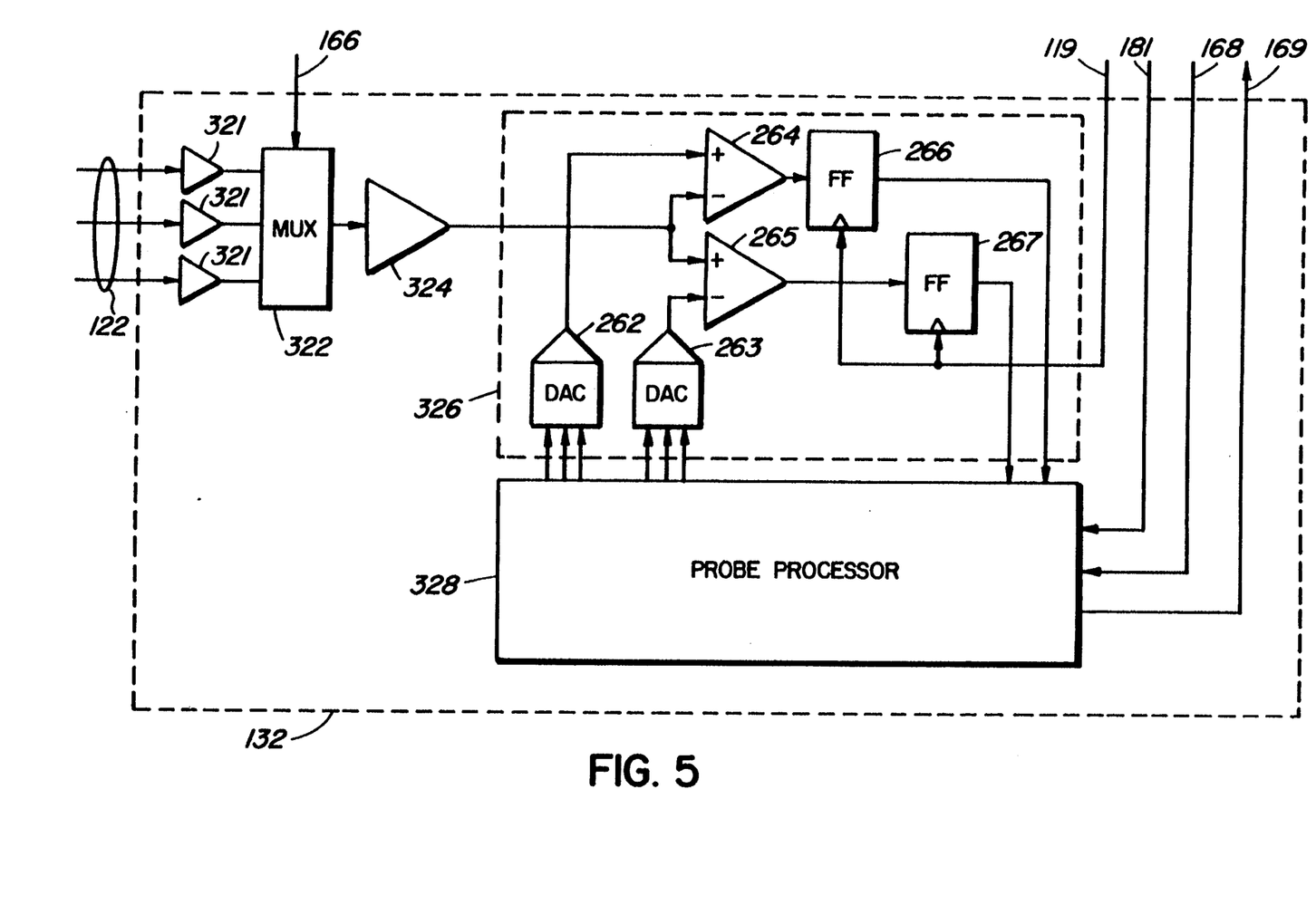
FIG. 5 is a block schematic diagram of a signal analysis element of the tester of FIG. 1.

FIG. 5 is a block schematic diagram of one signal analysis element 132 of the signal analyzer 130. The signal analysis element 132 comprises a plurality of buffers 321, a multiplexor 322, an amplifier 324, a comparison circuit 326, and a probe processor 328 including a memory. The multiplexor 322 responds to a signal provided by the master processor 116 on a probe selection lead 166 to select a signal on one of the probe leads 122 connected via a respective buffer 321 to the multiplexor 322. The amplifier 324 conditions the selected signal for further analysis. The comparison circuit 326 comprises upper and lower limit digital to analog converters 262, 263, upper and lower limit comparators 264, 265, and upper and lower limit flip flops 266, 267 connected as shown in FIG. 5.

The signal analysis element 132 is operable in a data encoding mode and in a data comparison mode. In the data encoding mode, the lower limit digital to analog converter 262 converts digital codes supplied by the probe processor 328 to analog reference signals for comparison to the amplified signal by the lower limit comparator 264. The result of the comparison is provided to the lower limit flip flop 266, which is timed by the sampling pulse provided by the timing circuit 118. The probe processor 328 polls the RS flip flop 186 of the timing circuit 118 and samples the output of the lower limit flip flop 266 when the RS flip flop 186 is set by the sampling pulse. In the data encoding mode, arbitrary digital codes may be supplied by the probe processor 328 to the upper limit digital to analog converter 263, and the output of the upper limit flip flop 267 may be ignored by the probe processor 328. Alternatively, the upper limit digital to analog converter 263, comparator 265 and flip flop 267 may be disabled during operation of the signal analysis element 132 in the data encoding mode.

Figure 6:
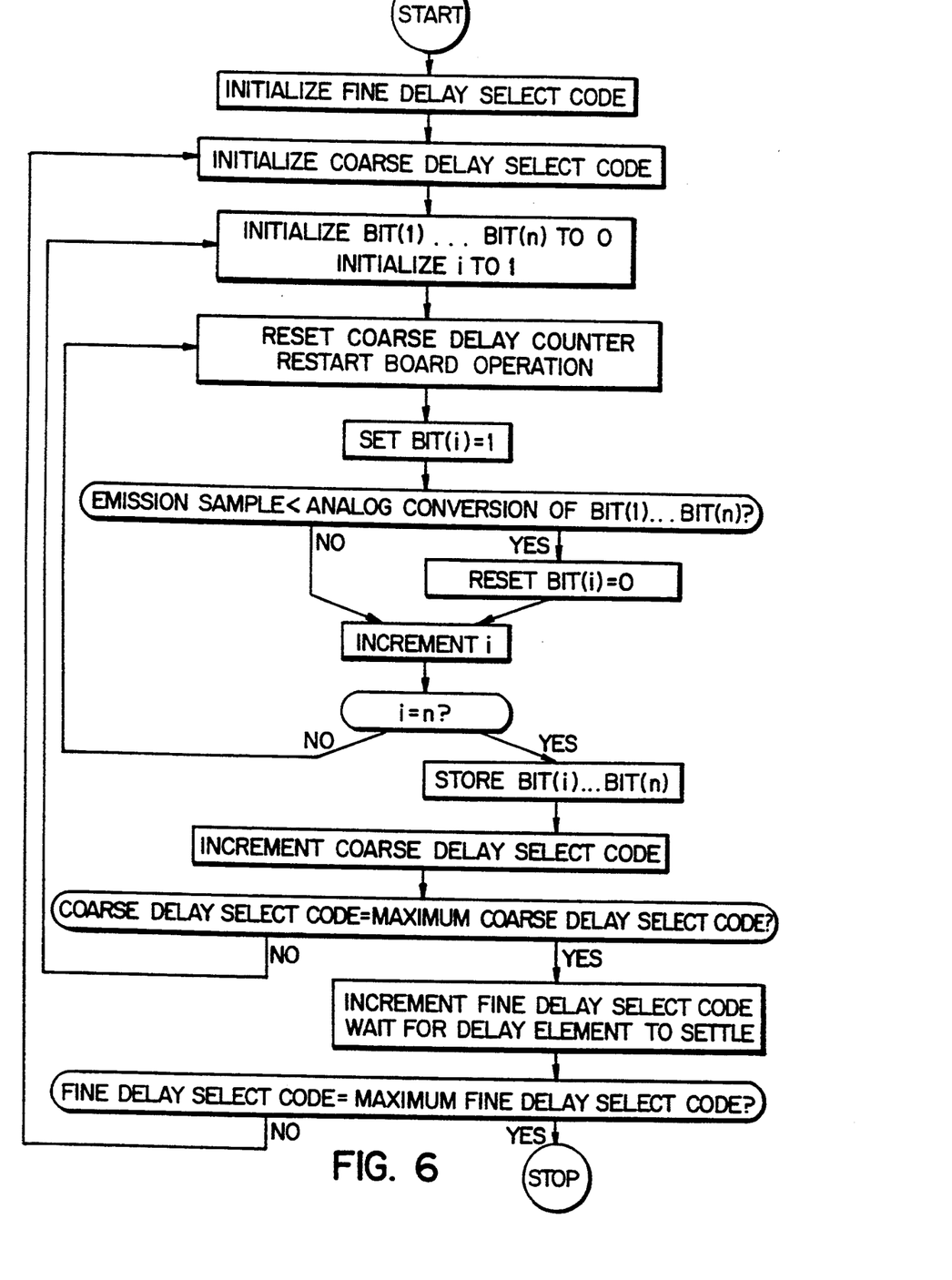
FIG. 6 is a flowchart showing an algorithm used by the tester of FIG. 1 for encoding samples of electromagnetic emission from an electronic circuit board.

During operation of the signal analysis element 132 in the data encoding mode, the probe processor 328 and the master processor 116 control the comparison circuit 326 according to a successive approximation algorithm to digitally encode the amplified signal. FIG. 6 is a flowchart illustrating the algorithm used.

In the algorithm of FIG. 6, the circuit board 200 is periodically restarted to provide a reference point for the sampling operation. This periodic restarting of the circuit board 200 ensures that the electromagnetic emissions sensed by each of the probes 120 defines a repetitive waveform. A single analog sample is taken from each period of the repetitive waveform at a sampling point having a predetermined delay with respect to the restarting of the circuit board 200. The predetermined delay of each sampling point is a sum of an integer number of fine delay increments (determined by the current value of the fine delay select code) and an integer number of coarse delay increments (determined by the current value of the coarse delay select code). Each sample of the repetitive waveform is used to determine one bit of an n bit digital code representing the repetitive waveform at each sampling point. Consequently, n successive samples are taken at each sampling point before incrementing the delay select codes to move to a next sampling point.

The delay element 182 requires some time to settle after each change of the fine delay select code, so the coarse delay select code is changed more frequently than the fine delay select code. This minimizes the impact of the delay lock loop settling time on the data encoding rate.

When the signal analysis element 132 is operated in a data comparison mode, the probe processor 328 supplies stored digital codes to both upper and lower limit digital to analog converters 262, 263. The digital to analog converters 262, 263 convert the digital codes to upper and lower limit analog signals for comparison to the amplified signal by the upper and lower limit comparators 264, 265 respectively. The results of the comparison are provided to the flip flops 265, 266, which are timed by the sampling pulse provided by the timing circuit 118 to couple the results to the probe processor 328. The results of the comparison indicate whether the amplified signal is between upper and lower limits specified by the probe processor 328 at the sampling point.

Figure 7:
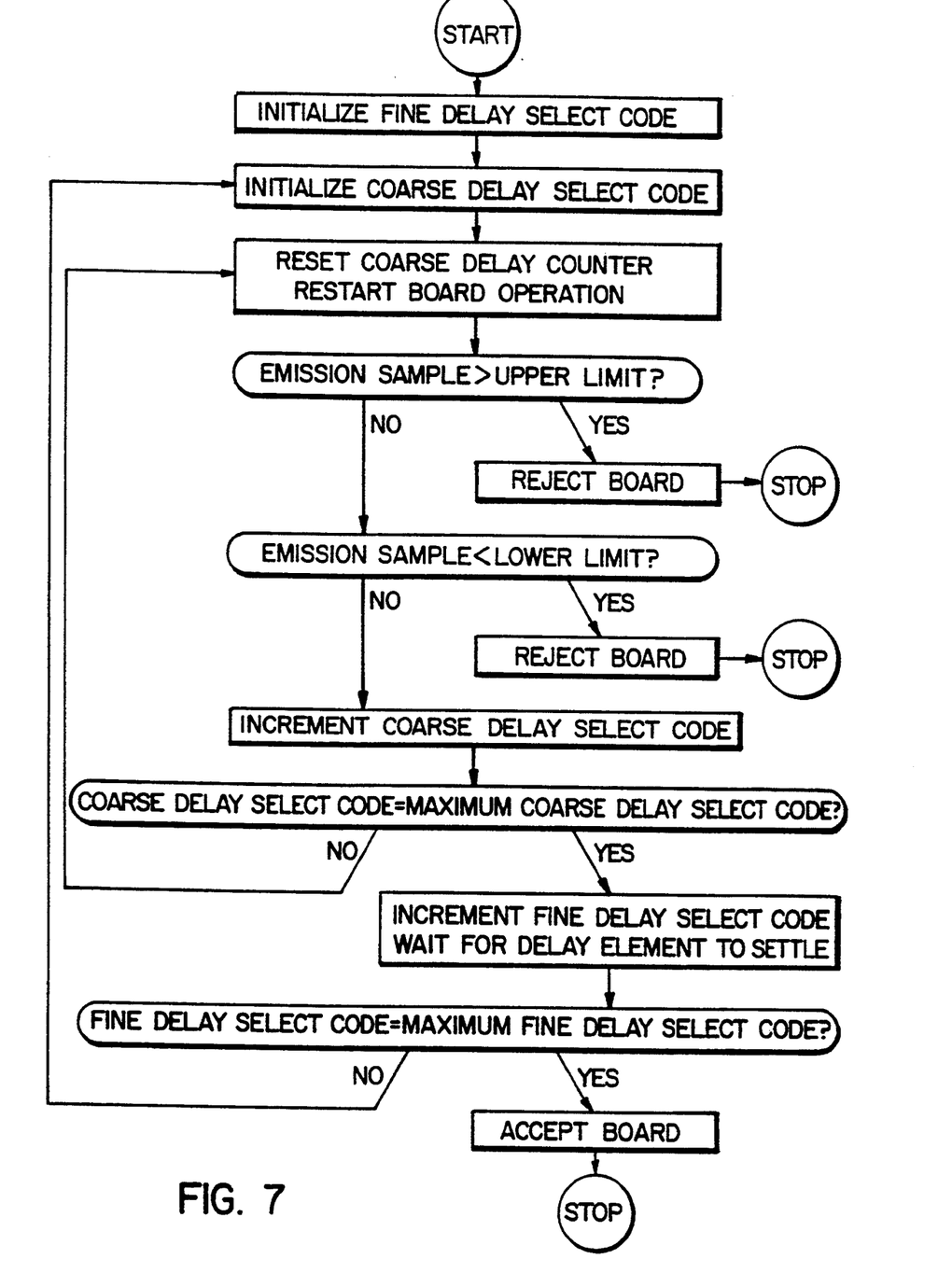
FIG. 7 is a flowchart showing an algorithm used by the tester of FIG. 1 for comparing samples of electromagnetic emission from an electronic circuit board to samples of electromagnetic emission from an electronic circuit board known to be operating properly.

FIG. 7 is a flowchart showing the algorithm used in comparison mode. The circuit board 200 is rejected if any of the samples fall outside of the specified upper and lower limits for those samples. The circuit board 200 is accepted only if all samples are between the specified limits.

Communication between the master processor 116 and the probe processors 328 is provided via buses 168, 169.

Numerous modifications may be made to the embodiment described without departing from the inventive concept.

The analog to digital conversion technique used to digitally encode sampled electromagnetic emission in the above embodiment is considered particularly advantageous for low cost encoding of high speed repetitive waveforms. Low cost encoding is particularly important if a large number of signal analysis elements are required to achieve high speed, high resolution testing. Nevertheless, modified analog to digital conversion techniques could be used without departing from at least some aspects of the invention.

Figure 8:
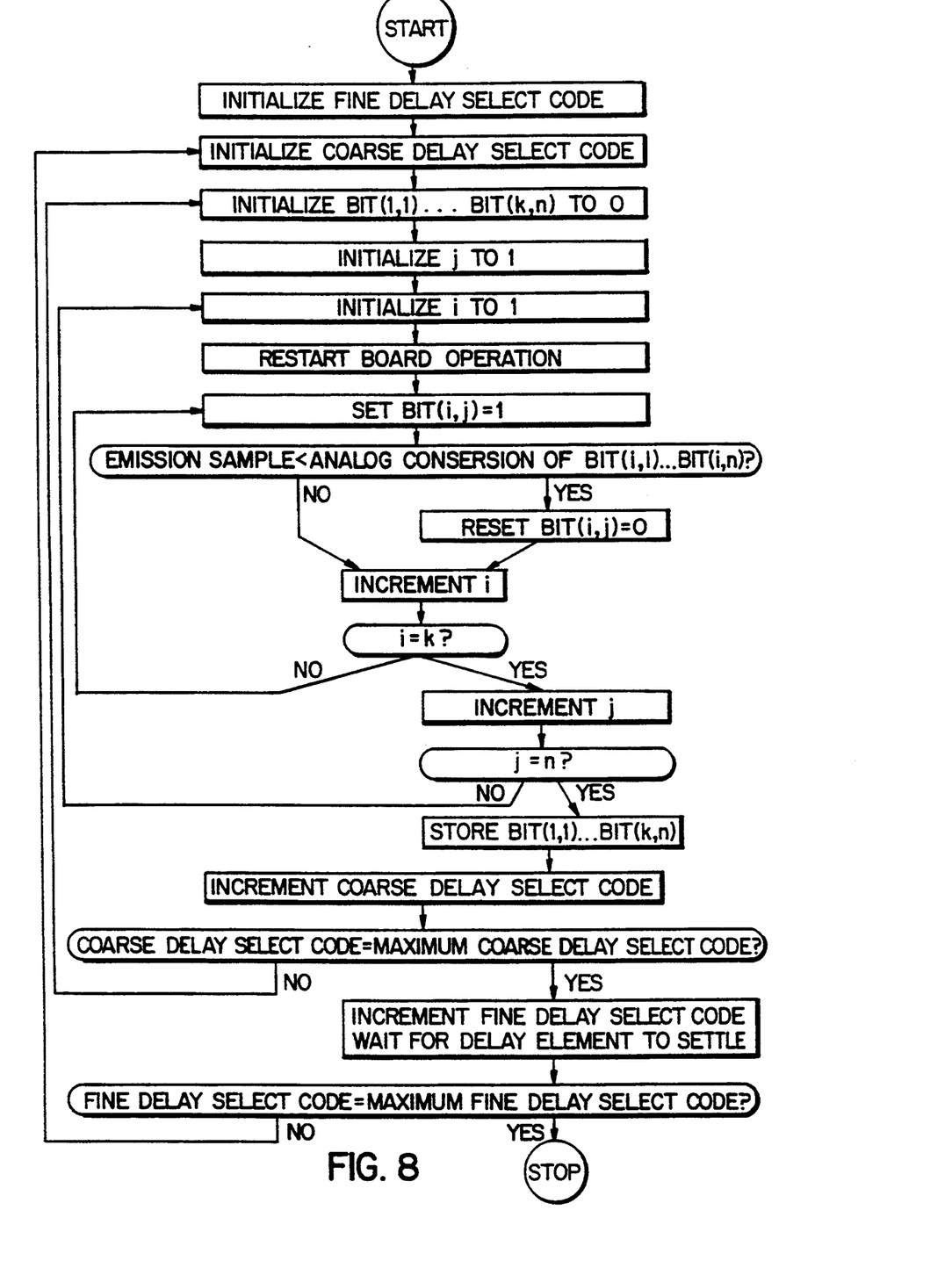
FIG. 8 is a flowchart showing an alternative algorithm for encoding samples of electromagnetic emission from an electronic circuit board.

For example, sampling algorithms other than those illustrated in FIGS. 6 and 7 could be employed. In the algorithms of FIGS. 6 and 7, operation of the circuit boards 200, 200' is periodically restarted at successive restart times, and electromagnetic emission is sampled from the circuit boards 200, 200' at a single sampling point between successive restart times. The sampling points have predetermined delays with respect to the restart times, and these delays are incremented through a series of coarse delay increments for each of a series of fine delay increments. Instead of taking a single sample between successive restart times, multiple samples could be taken between successive restart times. FIG. 8 is a flow chart illustrating such a sampling algorithm, which is potentially faster than the algorithm illustrated in FIGS. 6 and 7.

In the algorithm of FIG. 8, k distinct samples of the repetitive waveform are taken at k distinct sampling points between successive restarts of the circuit board 200. A single bit is derived from each of the k distinct samples. The k distinct samples are taken at the same k distinct sampling points for n successive restarts of the circuit board to derive an n bit code for each of the k distinct sampling points. The coarse delay select code (and in some instances the fine delay select code) are then changed so that the repetitive waveform is sampled at another set of k distinct sampling points.

The coarse and fine delay select codes for each set of k sampling points define a base delay for each set of k sampling points. Incrementation of the variable i corresponds to running the master clock signal MCLK through a fixed number of cycles before taking the next sample. The number of master clock cycles corresponding to each incrementation of the variable i defines a delay increment which must be large enough to permit completion of the required changes to the bit values and completion of the required comparisons between incrementations of the variable i. Consequently, each sampling point has a respective delay relative to a board restart time, that respective delay being the sum of a base delay determined by the coarse and fine delay select codes and an integer number i of delay increments. The base delays are different for each set of k sampling points, and the delay increments are the same for all sets of k sampling points.

The delay increment between successive sampling points in each set of k sampling points is relatively large, and the sizes of the coarse and fine delay increments are arranged so that successive sets of k sampling points fill gaps in previous sets of k sampling points.

As in the algorithm of FIG. 6, the coarse delay select code is changed more frequently than the fine delay select code to minimize the impact of the delay lock loop settling time on the data encoding rate.

The analog to digital conversion technique could also use a method other than successive approximation to derive the digital bits from the analog signal.

While described above in relation to the digital encoding of sensed electromagnetic emissions, the waveform encoding techniques described above are generally applicable to the encoding of any repetitive analog waveform, and are particularly applicable to the encoding of high speed waveforms. In the context of high speed waveforms, it may be advantageous to interleave the waveform periods from which samples are taken with waveform periods from which no samples are taken to limit operating speed requirements on the encoding hardware.

For other encoding applications, the architecture may be simplified. For example, where the processing requirements are not too demanding, the functions of the probe processors 328 could be performed by the master processor 116, thereby permitting elimination of the probe processors 328. Some processor functions could be performed by hardwired logic at higher operating speeds. The multiplexors 322 are not required if a comparison circuit 326 is provided for each analog signal source, and the amplifier 324 is not required if the analog signal is sufficiently strong.

Some benefits of the encoding method described above could be obtained even if more than one bit of the n-bit words is derived from each sample. For example, several comparison circuits 326 could be connected in parallel to each probe 120 to derive several bits of each n-bit word from each sample. While this would reduce the number of samples required to derive complete n-bit words by a factor equal to the number of comparison circuits 326 connected in parallel to each probe 120, the parallel connection of the comparison circuits 326 would result in capacitive loading. Consequently, the number of comparison circuits 326 connected in parallel to each probe 120 should be n/2 or less to achieve significant benefits over known encoding techniques.

These and other modifications do not depart from the invention as defined below.

I claim:

1. A method for encoding a repitittive analog waveform as m n-bit digital words, where m and n are positive integers, the method comprising taking analog samples of the repetitive waveform at each of m distinct sampling points, each of the m distinct sampling points having a respective predetermined delay with respect to a reference point on the repetitive waveform and digitally encoding the analog samples, wherein each predetermined delay is a sum of an integer number of fine delay increments defined by a delay lock loop and an integer number of coarse delay increments defined by a counter, each coarse delay increment corresponding to multiple fine delay increments and the delay is incremented through a full cycle of coarse delay increments before each addition of a fine delay increment.

2. Apparatus for encoding a repetitive analog waveform as m n-bit digital words, where m and n are positive integers, the apparatus comprising:
   a sampler for taking analog samples of the repetitive waveform at each of m distinct sampling points, each of the m distinct sampling points having a respective predetermined delay with respect to a reference point on the repetitive waveform, the sampler comprising:
   a clock generator for generating a clock signal at a clock rate;
   a sampling pulse generator for deriving sampling pulses from the clock signal;
   a fine delay element comprising a delay lock loop responsive to a fine delay select code to delay the sampling pulses relative to the clock signal by a fine delay corresponding to the fine delay select code;
   a coarse delay element comprising a counter for counting sampling pulses and a switching arrangement responsive to the counter and a coarse delay select code for selectively passing only delayed sampling pulses having a coarse delay corresponding to the coarse delay select code; and
   a processor operable to cycle the fine delay select code and the coarse delay select code such that the delay is cycled through a full range of coarse delay increments before each addition of a fine delay increment; and
   an encoder for digitally encoding each sample.

3. Apparatus for encoding a repetitive analog waveform as m n-bit digital words, where m and n are positive integers, the apparatus comprising:
   a sampler for taking n distinct analog samples of the repetitive waveform at each of m distinct sampling points, each of the m distinct sampling points having a respective predetermined delay with respect to a reference point on the repetitive waveform, the sampler comprising:
   a clock generator for generating a clock signal at a clock rate;
   a sampling pulse generator for deriving sampling pulses from the clock signal;
   a fine delay element responsive to a fine delay select code to delay the sampling pulses relative to the clock signal by a fine delay corresponding to the fine delay select code; and
   a processor operable to cycle the fine delay select code; and
   an encoder for digitally encoding each sample; wherein:
   the fine delay element is responsive to the fine delay select code and the clock signal to generate a modified clock signal having a duty cycle which corresponds to the fine delay select code; and the sampling pulse generator comprises a frequency multiplier operable to generate sampling pulses at a multiple of the clock rate, the sampling pulses being synchronized to a trailing edge of the modified clock signal.

4. Apparatus as defined in claim 3, wherein the sampling pulse generator further comprises:

a counter for counting sampling pulses; and a sampling pulse gate responsive to outputs of the counter and to a coarse delay select code to compare the outputs of the counter to the coarse delay select code and to pass a sampling pulse only when the outputs of the counter match the coarse delay select code, the processor being operable to cycle the coarse delay select code.

5. Apparatus as defined in claim 4, wherein the processor is operable to cycle the coarse delay select code through a full range of values for each value of the fine delay select code before changing the fine delay select code.

* * * * *